United States Patent [19]

Thornburg

[11] 4,172,757

[45] Oct. 30, 1979

[54] PROCESS FOR MAKING ELECTRODE WITH INTEGRAL DIELECTRIC LAYER

[75] Inventor: David D. Thornburg, Los Altos, Calif.

[73] Assignee: Xerox Corporation, Stamford, Conn.

[21] Appl. No.: 842,636

[22] Filed: Oct. 17, 1977

[51] Int. Cl.² ............................................. C23F 1/02
[52] U.S. Cl. .................................. 156/630; 96/36.7; 156/307; 156/634; 156/656; 156/659
[58] Field of Search ............ 29/622, 630 R; 200/5 A, 200/159 R, 159 B, 159 A; 96/35.1, 36.2, 38.4; 156/656, 659, 630, 634, 643, 646, 307; 134/11, 31, 37; 427/299, 327

[56] References Cited

U.S. PATENT DOCUMENTS

| | | | |
|---|---|---|---|
| 3,469,982 | 9/1969 | Celeste | 96/83 X |
| 3,950,569 | 4/1976 | Morgan | 96/36.2 X |
| 3,950,846 | 4/1976 | Johnson | 29/630 R |
| 3,968,336 | 7/1976 | Johnson | 200/5 A |
| 3,969,595 | 7/1976 | Johnson | 200/5 A |

*Primary Examiner*—William A. Powell
*Attorney, Agent, or Firm*—Leonard Zalman

[57] ABSTRACT

A process of fabricating switching device electrodes with an integral dielectric layer. The method permits the dielectric layer to serve also as the photoresist during the electrode etching step of the process.

1 Claim, 4 Drawing Figures

PROCESS FOR MAKING ELECTRODE WITH INTEGRAL DIELECTRIC LAYER

BACKGROUND OF THE INVENTION

The conventional process for making capacitive switching devices, such as the switching devices of the keyboards described in U.S. Pat. Nos. 3,968,336 and 3,969,595, includes the steps of providing on a layer of conductive material a photoresist having a desired spring pattern configuration, removing by acid treatment the portions of the layer of conductive material not protected by the photoresist, removing the photoresist to provide one or more discrete electrode areas, and applying an insulating (dielectric) curable adhesive layer to each of the discrete electrode areas. The insulating (dielectric) layer, which limits the magnitude of the capacitive reactance when the switching mechanism is fully depressed, is applied by a spraying process, such as by aerosol spraying of a solvent-based lacquer which dries to a smooth insulating layer.

Due to its method of deposition, the dielectric suffers from non-uniformity of thickness between different electrode areas, as well as non-uniformity over each individual electrode area. Furthermore, the dielectric is subject to pinhole formation. Another disadvantage of a dielectric deposited as described is that the increased handling of the conductive layer having the discrete electrode areas strongly increases the likelihood of damage to the fragile electrode areas.

OBJECTS OF THE INVENTION

An object of the present invention is to simplify the method of making capacitive type switching devices.

Another object of the present invention is to provide an economical method of making a capacitive type switching device.

A further object of the present invention is to provide a method whereby a keyboard dielectric has excellent adhesion to a keyboard electrode.

SUMMARY OF THE INVENTION

The present invention encompasses a method of fabricating switching device electrodes with an integral dielectric layer. More specifically, the dielectric layer also serves as the photoresist during the electrode etching step of the switching device fabrication process. The advantages which are provided by using the dielectric as the resist include:

(a) reduction of the number of fabrication steps;

(b) excellent smoothness of the exposed surface of the dielectric resist layer, with concomitant reduction in the likelihood of dust entrapment;

(c) some overhang of photoresist over the edges of the electrode surface, thus reducing the likelihood of electrical shorts from the edge of the electrode surface;

(d) uniform thickness of the dielectric resist layer, which should ensure a more uniform and reproduceable capacitive reactance change upon switch closure;

(e) excellent adhesion between the electrode surface and the dielectric/photoresist layer.

DETAILED DESCRIPTION OF THE INVENTION

Figure 1:
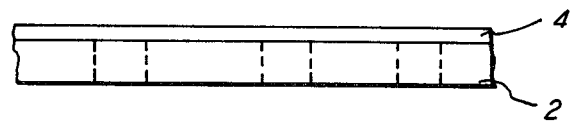
FIGS. 1–4 depict steps in the process of the present invention.

Referring to FIG. 1, there is shown a conventional circuit board comprised of an apertured laminate 2 of electrically non-conductive material which has affixed to one surface thereof a continuous sheet 4 of a conductive material, such as beryllium copper. Sheet 4 is cleaned by a standard process, such as by vapor degreasing in Baron-Blakeslee TCM. Special precaution should be taken at the end of the cleaning to insure that the sheet 4 is free of all water.

In accordance with the invention, excellent adhesion or bond strength between the material of sheet 4 and the dielectric/photoresist layer to be applied is achieved by immersing the circuit board of FIG. 1 in a bath of an adhesion promotion agent. A suitable agent for this purpose when sheet 4 is beryllium copper is a 5% solution of 1, 1, 1, 3, 3, 3 hexamethyldisilazane in Stoddard solvent which is available in premixed form from KTI. Upon removal from the bath the circuit board should be supported vertically in the presence of a gentle stream of a dry, non-reactive gas, such as nitrogen, to drive off any excess adhesion promotion agent. If nitrogen gas is used to drive off hexamethyldisilazane, it is preferred that the nitrogen be obtained by distillation from liquid nitrogen to insure dryness. Furthermore, the circuit board should be dusted off with a filtered nitrogen stream which has been exposed to ionizing radiation, such as by passage through an anti-static spray gun, which will drive off dust particles that are of sufficient size to cause pinholes in the dielectric/resist layer to be applied to the sheet 4.

Figure 2:
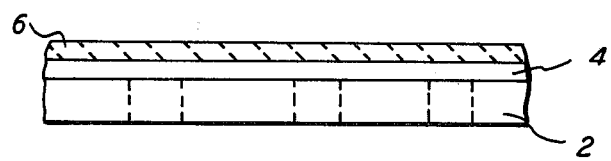

As shown by FIG. 2, the sheet 4 of the circuit board is laminated now with a thin layer 6 of a material that is both an electrical dielectric and a photoresist. By photoresist it is meant that the material can be cured in a desired electrode pattern by irradiation by an appropriate light source and is resistant to an etching solution when so cured. Suitable materials for layer 6 are dry film photoresists and dry film solder mask photoresists. One example of a suitable dry film photoresist is RISTON II (available from DuPont) which is applied to the sheet 4 by hot roll lamination at a temperature in the range of 220° F. The layer 6 should be thin, a thickness of about 0.001" being appropriate. Other usable dry film photoresists for layer 6 include DuPont 211R and DuPont 210. Suitable dry film solder mask photoresists include DuPont 740S and DuPont 730S.

Figure 3:
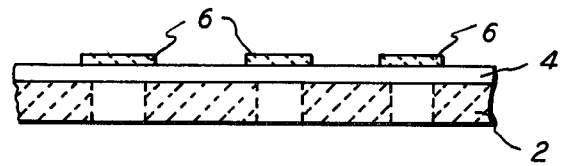

Dielectric/resist layer 6 of the device of FIG. 2 is now exposed in a conventional manner to a pattern of radiation of a wavelength which renders those portions of layer 6 exposed to the radiation inert to a developer. The exposure of layer 6 is achieved in a conventional manner, such as by projecting a light pattern onto the dielectric/resist layer or by providing a pattern mask in contact with the layer 6 and flooding the pattern mask with light. When the dielectric/photoresist is RISTON II, light having a wavelength of about 340–380 nm is sufficient for exposing the layer 6. The exposed dielectric/photoresist layer 6 is now immersed in an appropriate developer bath which removes those portions of layer 6 not subject to the exposing radiation, whereby the dielectric/resist layer has a desired pattern, as shown in FIG. 3. When the dielectric/photoresist layer 6 is RISTON II, a suitable developer is DuPont D-2000 which is a spray developer at 35° C. Conventional developers would be used for other dry film and dry film solder mask photoresists.

Figure 4:

Following covering of the backside of the circuit board with an etch protective layer, such as by a layer of lacquer, the circuit board is immersed in a standard etching apparatus which etches away the exposed portions of layer 4. When layer 4 is beryllium copper, suitable etchants include ferric chloride based etchants and other etchants used in the fabrication of etched circuit boards. As soon as the exposed portions of the layer 4 have been etched through, the circuit board is removed from the etching apparatus and placed in an etch stop, such as water, to keep the exposed backsides of the electrodes from being damaged. FIG. 4 depicts the circuit board after this final step of the process.

In conventional circuit board processes for forming switching devices, the portions of the photoresist forming the resist pattern are now removed and regions of an insulating, curable adhesive are applied to the electrode portions of the circuit board, the regions of curable adhesive acting as the dielectric of capacitive switching devices. As noted, these regions suffer from non-uniformity of thickness and pinhole formation, and formation of the regions requires additional handling of the fragile switching device. By selecting a suitable material as the resist, the process of the present invention permits the resist material to remain and function additionally as the switch dielectric. Thus, the conventional process is greatly simplified. In addition, since dry film photoresists and dry film solder mask photoresists can be applied with uniform thickness over the entire surface of the layer 4, the dielectric regions 6 will be of uniform thickness and pinhole free and thus very adaptable for capacitive switching.

I claim:
1. A process of making switching device electrodes having integral dielectric material coatings comprising the steps of:

treating a surface of a sheet of electrically conductive material with an adhesion promoting agent;

exposing the treated surface of a dry, non-reactive gas to drive off any excess adhesion promoting agent;

exposing the treated surface to a dry, non-reactive gas which has been exposed to ionizing radiation to drive dust particles off of the treated surface;

applying by means of hot roll lamination a uniformly thick layer of a dry film photoresist material having dielectric properties to the treated surface of said sheet of electrically conductive material;

exposing portions of said layer to radiation of a wavelength which cures said portions of said layer to render said portions of said layer inert to a developer, bringing a developer into contact with said layer whereby the portions of said layer which have not been cured by said radiation are removed from said sheet, and bringing an etchant solution into contact with said sheet of electrically conductive material and said cured portions of said layer whereby the portions of said sheet not protected by cured portions of said layer are etched away by said etchant solution and the remaining portions of said sheet protected by cured portions of said layer remain, at least some of said remaining portions of said sheet providing switching device electrodes, removing the remaining portions of said sheet from said etchant, and permitting said cured portions of said layer to remain on said at least some of said remaining portions of said sheet whereby the switching device electrodes are provided directly with a uniformly thick, pinhole defect free, dielectric coating without additional dielectric coating.

* * * * *

UNITED STATES PATENT AND TRADEMARK OFFICE
CERTIFICATE OF CORRECTION

PATENT NO. : 4,172,757
DATED : October 30, 1979
INVENTOR(S) : David D. Thornburg It is certified that error appears in the above-identified patent and that said Letters Patent are hereby corrected as shown below:

Claim 1, line 6, change "of" to --to--.

line 20, delete "and".

Signed and Sealed this

Fourth Day of March 1980

[SEAL]

*Attest:*

SIDNEY A. DIAMOND

*Attesting Officer*    *Commissioner of Patents and Trademarks*